United States Patent [19]

Takahashi et al.

[11] Patent Number: 5,012,240
[45] Date of Patent: Apr. 30, 1991

[54] PARALLEL TO SERIAL CONVERTER WITH COMPLEMENTARY BIT INSERTION FOR DISPARITY REDUCTION

[75] Inventors: Shoichi Takahashi; Sayohiko Ichiki; Masatoshi Yorozu; Seiji Kunishige; Taro Shibagaki, all of Tokyo; Fumihiko Shimizu, Yokohama; Fumio Fujioka; Toshinori Kondo, both of Tokyo, all of Japan

[73] Assignees: Nippon Hoso Kyokai, Tokyo; Kabushiki Kaisha Toshiba, Kawasaki, both of Japan

[21] Appl. No.: 544,259

[22] Filed: Jun. 26, 1990

[30] Foreign Application Priority Data

Dec. 28, 1988 [JP] Japan .............................. 63-333611
Dec. 28, 1988 [JP] Japan .............................. 63-333612

[51] Int. Cl.⁵ .............................................. H03M 9/00
[52] U.S. Cl. ...................................... 341/101; 341/58
[58] Field of Search ................. 341/58, 59, 68, 69, 341/73, 93, 100, 101; 375/19

[56] References Cited

U.S. PATENT DOCUMENTS

| | | | |
|---|---|---|---|
| 3,631,471 | 12/1971 | Griffiths | 341/58 |
| 4,488,295 | 12/1984 | Sharper | 341/101 X |
| 4,544,916 | 10/1985 | Sharper | 341/101 X |
| 4,617,552 | 10/1986 | Kojima et al. | 341/58 |

FOREIGN PATENT DOCUMENTS

| | | | |
|---|---|---|---|
| 63-194422 | 8/1988 | Japan | 341/101 |
| 2098432 | 11/1982 | United Kingdom | 341/58 |

Primary Examiner—J. R. Scott
Assistant Examiner—Howard Williams
Attorney, Agent, or Firm—Oblon, Spivak, McClelland, Maier & Neustadt

[57] ABSTRACT

A signal conversion circuit is used to convert a parallel signal to a serial signal and comprises a parallel input/serial output type of shift register having input terminals corresponding in number to at least n+k bits (n and k: integer), an inverting circuit and a timing circuit. The n-bit input parallel signal is applied to n successive input terminals of the shift register and k bit of the n-bit parallel signal is inverted by the inverting circuit to be applied to the remaining k input terminal of the shift register. The (n+k)-bit parallel signal loaded into the shift register is serially output at a predetermined rate by the timing circuit to provide a serial signal.

10 Claims, 5 Drawing Sheets

PARALLEL TO SERIAL CONVERTER WITH COMPLEMENTARY BIT INSERTION FOR DISPARITY REDUCTION

BACKGROUND OF THE INVENTION

1. Field of the Invention

The present invention relates to a signal conversion circuit for converting a parallel signal to a serial signal in which the continuance of identical bits (0s or 1s) is suppressed, which may be used in a video signal transmitter by way of example.

2. Description of the Related Art

In the case of non-return-to-zero (NRZ) encoding and alternate mark inversion (AMI) encoding which are often used as a transmission encoding method, there is the possibility that 0s or 1s continue for a long period of time according to circumstances. This may cause synchronization problems. For this reason, heretofore, various measures have been taken to avoid the continuance of 0s or 1s. For example, an identical-bit-continuance suppression code is used in base band transmission. Systems using the identical-bit-continuance suppression code include various systems such as a system in which NRZ data is converted to a CMI (coded mark inversion) code. Among them there is a system in which (n+1)-bit parallel data is converted to serial data and a complementary code is inserted in one redundant bit for data transmission.

The system includes a parallel input/serial output type of shift register having as many input terminals as there are bits in the parallel data (5 bits in this example). Upon receipt of the parallel data, the shift register is supplied with a load signal LOAD and a shift clock signal CLKS from a timing generator. Thus, the parallel data is loaded into the shift register in synchronization with the load signal LOAD and then serially read from the shift register as serial data SD1 in synchronization with the shift clock signal CLKS. In this case the shift clock signal CLKS is formed such that clock pulses are removed from clock signal CLK1, having a frequency corresponding to six times the transmission rate of the parallel data, one pulse every sixth pulse. Thus, the serial data SD1 read from the shift register will have one redundant bit added to the serial data obtained by serial conversion of the parallel data That is, the serial data SD1 having a redundant bit is read from the shift register. The data SD1 is entered into a complementary code inserting circuit where, after its sign is inverted, it is subjected to logical processing in synchronization with an insertion timing signal CLOAD so that a complementary code is inserted into the redundant bit. The serial data in which the complementary code has been inserted is output from the inserting circuit in synchronization with the clock signal CLK1.

In this way, serial data SD is obtained by converting 5-bit parallel data to 6-bit data having a complementary code. The transmission of such data SD will suppress the continuance of, for example, 0s in parallel data to a maximum of 5 bits, thus permitting data to be surely reproduced at a repeater or receiver.

However, the signal conversion circuit described above requires a shift register for parallel-to-serial conversion and a complementary code inserting circuit because it is arranged to convert parallel data to serial data having a redundant bit and insert a complementary code in the redundant bit. Moreover, the timing generating circuit is also required to regenerate an insertion timing and a special shift clock signal CLKS as well as a load signal LOAD. Therefore, the conventional signal conversion circuit needs a complex and elaborate circuit arrangement.

SUMMARY OF THE INVENTION

It is therefore an object of the present invention to provide a signal conversion circuit which is simple in construction and small in circuit scale.

According to the present invention, a signal conversion circuit for converting a parallel signal to a serial signal comprises a parallel input/serial output type of shift register having input terminals corresponding in number to at least n+k bits (n and k: integer), an inverting circuit and a timing circuit. The n-bit inout signal is applied to n successive input terminals of the shift register and at least one bit of the n-bit parallel signal is inverted by the inverting circuit to be applied to the remaining input terminal of the shift register. An (n+k)-bit parallel signal loaded into the shift register is serially output at a predetermined rate by the timing circuit to provide a serial signal.

As described above, in the present invention, the conversion of a parallel signal to a serial signal and the insertion of a complementary code are simultaneously performed in the shift register, thus obviating the necessity of providing a complementary code inserting circuit separately. The timing circuit is required only to generate a signal used to load the parallel signal into the shift register. Together with the fact that the complementary code inserting circuit is unnecessary, this will make the signal conversion circuit simple in circuit arrangement and small in size.

According to another aspect of the present invention there is provided a signal conversion circuit comprising a complementary code inserting circuit for converting (n+k)-bit first data (n and k: integer) containing n-bit original data to a second data and inserting a complementary code into the additional k bit or bits; and a scrambling circuit for generating a pseudo-random code to retain the complementary code in output data from the complementary code inserting circuit and scrambling the output data from the complementary code inserting circuit in accordance with the pseudo-random code.

According to this signal conversion circuit, transmission data is transmitted with the complementary code rule retained, thereby permitting the position of the complementary code to be detected simply and surely at a repeater or receiver. Thus, a predetermined process, such as a descrambling process, can be performed on transmission data. In addition, because the scrambling process can be performed after the complementary code has been inserted, there is no necessity of performing an operation of adding extra bits and an operation of inserting a complementary code in the extra bits individually by means of separate circuits, thus permitting the signal conversion circuit to be made simple in circuit arrangement.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
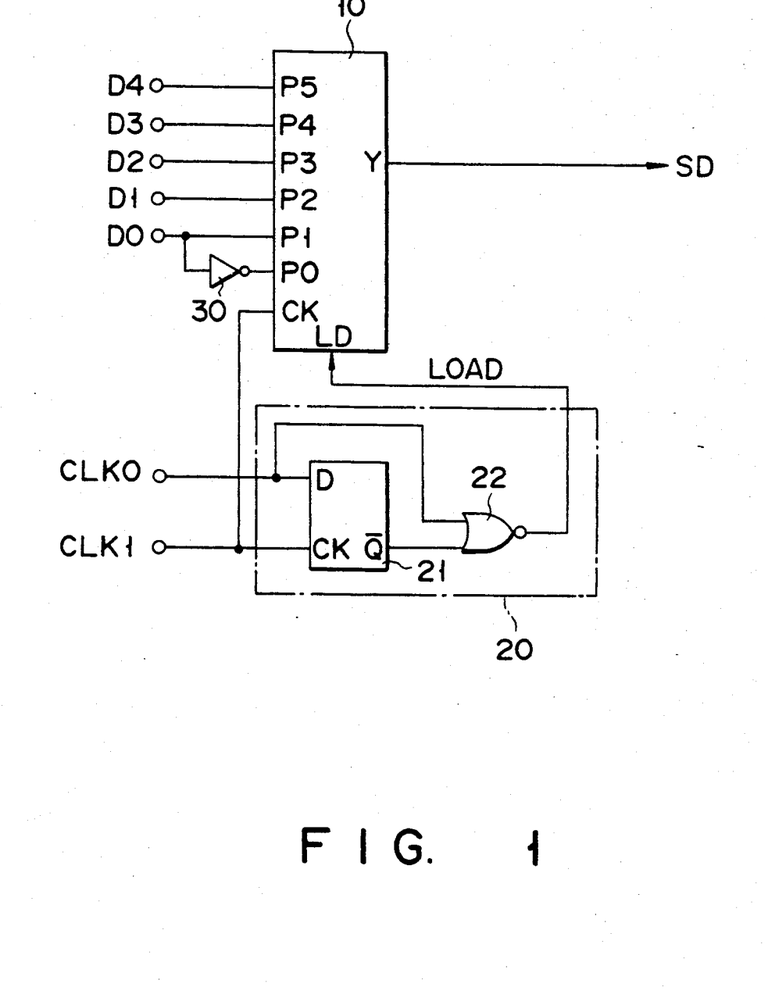
FIG. 1 is a block diagram of a signal conversion circuit embodying the present invention.

A signal conversion circuit according to an embodiment of the present invention will be described with reference to FIG. 1. In the present embodiment, a description is given of a case where 6-bit parallel data containing 5-bit parallel input data D0–D4 and one-bit data D5 are converted to serial data.

The signal conversion circuit comprises a parallel input/serial output type of shift register 10 having input terminals P0 to P5 which are larger in number than the bits in parallel data D0 to D4 by one, a timing circuit 20 and an inverter. Timing circuit 20 comprises a D flip-flop 21 connected to receive clock signals CLK0 and CLK1 and a NOR gate 22 connected to receive output Q of flip-flop 21 and clock signal CLK0.

In the signal conversion circuit, D flip-flop 21 latches clock signal CLK0 having a period corresponding to the data rate of parallel data D0 to D4 in synchronization with clock signal CLK1 having a frequency corresponding to the data rate of serial data SD, which is six times the data rate of the parallel data. Output Q of flip-flop 21 is NORed with clock signal CLK0 in NOR gate 22 to output a load signal LOAD, which is, in turn, supplied to a load terminal LD of shift register 10.

Inverter 30 is provided to invert bit D0 of parallel data D0 to D4, the inverted bit D0 being supplied to input terminal P0 of shift register 10. To shift clock input terminal CK of shift register 10 is applied clock signal CLK1 as it is.

Figure 2:
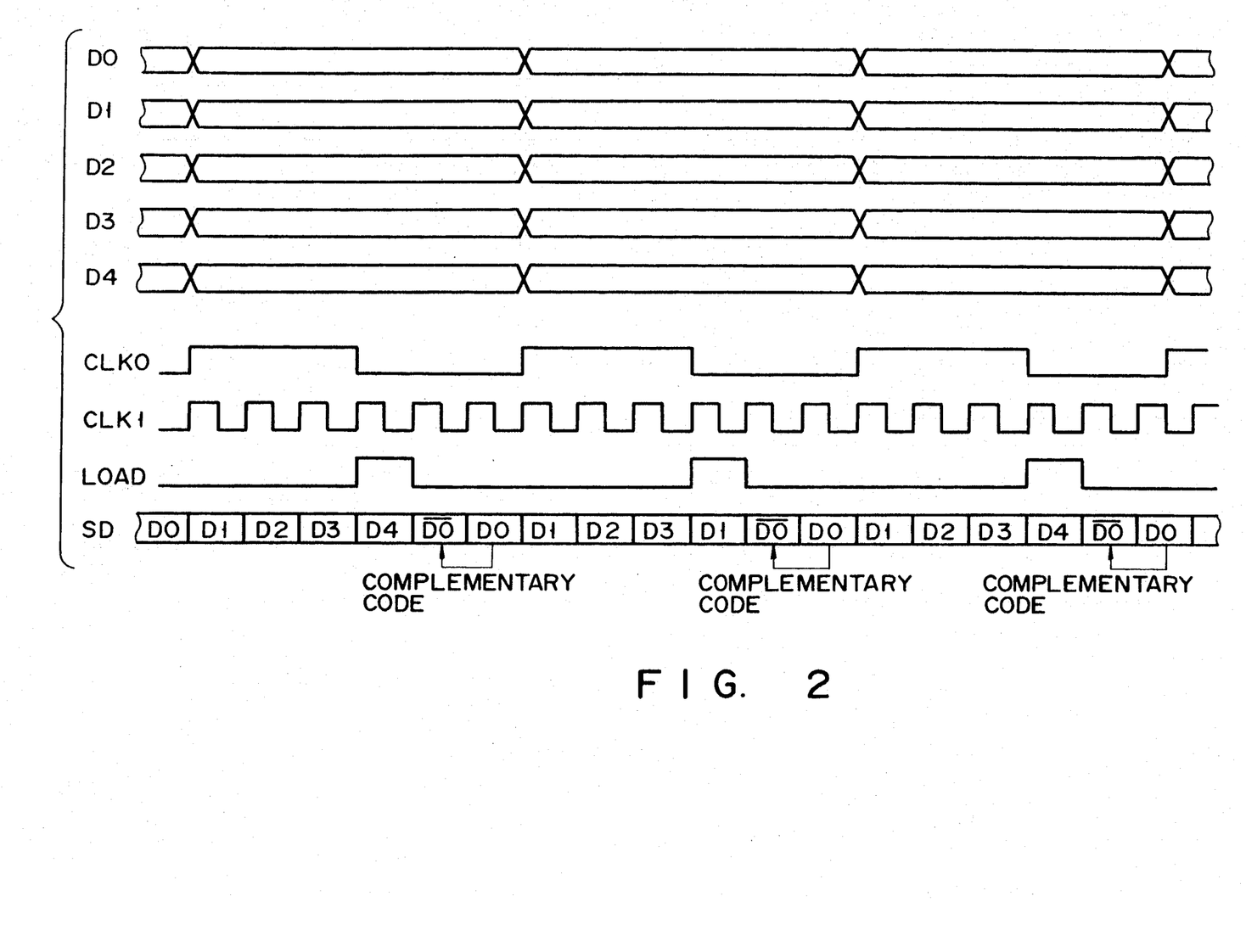
FIG. 2 is a timing chart for use in explanation of the operation of the circuit of FIG. 1.

In operation, parallel data P0 to P4 are applied to input terminals P1 to P4 of shift register 10 as it is, while the bit D0 of the parallel data is inverted by inverter 30 and then applied to input terminal P0 of shift register 10 as a complementary code $\overline{D0}$. When, in this state, a load signal LOAD is generated by timing circuit 20 in synchronization with the timing of arrival of parallel data P0 to P4 as indicated in FIG. 2, the parallel data and the complementary code are loaded into shift register 10 in synchronization with load signal LOAD. The parallel data and the complementary code are serially read out of shift register 10 in the order of $\overline{D0}$, D0, D1, D2, D3 and D4 as shown in FIG. 2 in synchronization with clock signal CLK1, thereby providing serial data SD. That is, parallel-to-serial converted and complementary-code inserted data SD is output from shift register 10.

The above embodiment obviates the necessity of providing a separate circuit for inserting a complementary code thus permitting the signal conversion circuit to be made simple in circuit arrangement and small in size. Also, timing circuit 20 has only to produce a load signal LOAD, thus permitting the significant simplification of its circuit arrangement. This will also make the entire circuit arrangement of the signal conversion circuit simple and small. Moreover, the present embodiment enables even the conversion of 4-bit parallel data D0 to D3 to serial data by use of input terminals P0 to P4 of shift register 10 without any circuit modification if the ratio between clock signals CLK0 and clock signal CLK1 is merely changed.

The parallel data are comprised of five bits in the above embodiment. Even if the parallel data are comprised of three bits, four bits or more than five bits, the present invention may be carried out by use of a shift register having input terminals the number of which is equal to the number of bits in the parallel data plus one. Although use is made of a shift register having input terminals the number of which is equal to the number of bits in parallel data D0 to D4 plus one in the above embodiment, a shift register having input terminals whose number is equal to a maximum number of bits of parallel data plus one may be provided in advance for converting parallel data having bits whose number is smaller than its maximum number of bits to serial data. For example, in a case of conversion of a video signal to a digital signal for transmission where 10 bits are enough for the number of bits of parallel data, a shift register having input terminals corresponding in number to 10+1 bits is provided in advance and, in another case, this shift register may be used to convert parallel data of, for example, 8 bits to serial data. If done so, the signal conversion circuit may be used in both cases without any circuit modification. Therefore, a signal conversion circuit which has wide usage and increased versatility can be provided. In addition, the signal conversion circuit is easy to integrate and its size will be decreased. The number of bits of the complementary code, the position in which the complementary code is inserted and the timing of loading of parallel data D0 to D4 may be modified variously.

According to the present invention, as described above, there is provided a signal conversion circuit which comprises a parallel input/serial output type o shift register having input terminals corresponding in number to at least n+k bits, an inversion circuit and a timing circuit and is arranged such that an n-bit parallel signal is applied to n successive input terminals of the shift register, k bit or bits of n bits of the parallel signal are inverted by the inversion circuit and the inverted bit or bits are applied to the remaining k input or inputs of the shift register. An (n+k)-bit parallel signal entered into the shift register is converted to a serial signal at a predetermined rate by the timing circuit to provide the serial signal. This signal conversion circuit is simple in construction and small in circuit scale.

Figure 3:
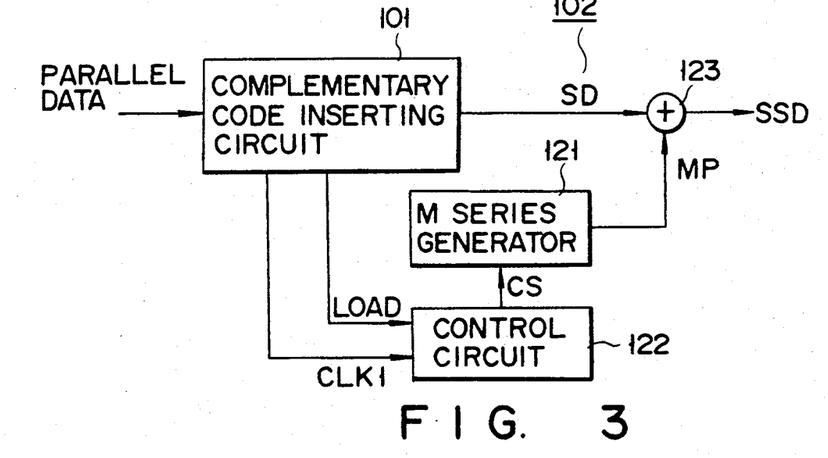
FIG. 3 is a block diagram of a signal conversion circuit according to another embodiment of the present invention.

Next, another embodiment of the present invention will be described with reference to FIG. 3.

A signal conversion circuit according to this embodiment is provided with a scrambling capability in addition to the features of the previous embodiment and comprises a complementary code inserting circuit 101 and a scrambling circuit 102.

Figure 4:
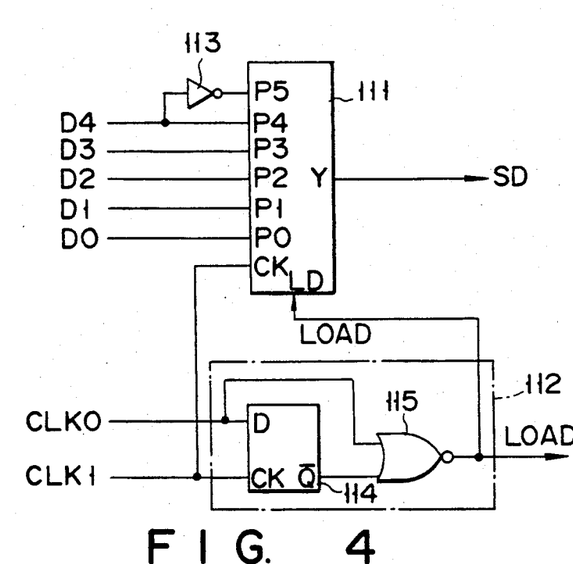
FIGS. 4 and 5 are block diagrams of main portions of the circuit of FIG. 3.

Supposing that incoming original parallel data have 5 bits D0 to D4, complementary code inserting circuit 101 comprises a parallel input/serial output type of shift register 111 having input terminals P0 to P5 the number of which corresponds to 6 bits and is one more than the number of bits in parallel data D0 to D4, a timing circuit 112 and an inverter 113. Timing circuit 112 is comprised of a D flip-flop 114 connected to receive clock signals CLK0 and CLK1 and a NOR gate 115 connected to receive the output $\overline{Q}$ of flip-flop 114 and clock signal CLK0. Clock signal CLK0, which defines the transmission rate of parallel data D0 to D4, is latched by D flip-flop 114 in synchronization with clock signal CLK1 which defines the transmission rate (six times that of the parallel data) of serial data SD. The output $\overline{Q}$ of flip-flop 114 is NORed with clock signal CLK0 in NOR gate 115 so that a load signal LOAD is supplied therefrom to load terminal LOAD of shift register 111. Inverter 113 is provided to invert bit D4 of parallel data D0 to D4 so as to apply the inverted bit D4 to shift-register input terminal P5 which is located on the most significant bit (MSB) side. Clock signal CLK1 is applied to shift clock input terminal CK of shift register 111 as it is.

Figure 5:
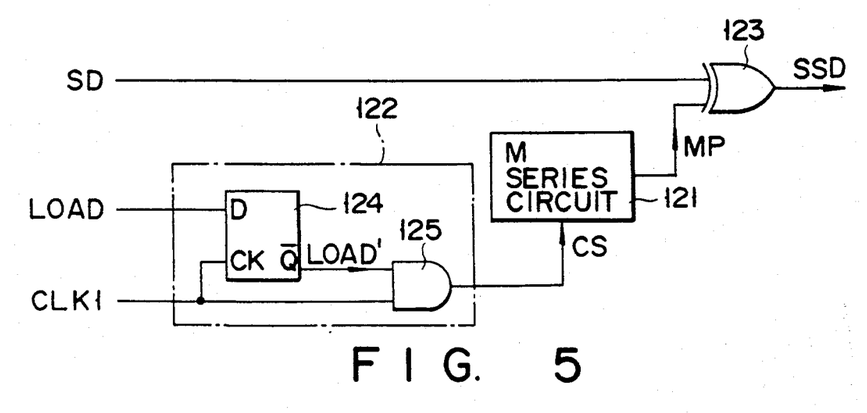

On the other hand, scrambling circuit 102 comprises an M series generator 121 for generating a pseudo-random pulse train MP, a control circuit 122 for controlling the operation of M series generator 121 and an exclusive OR circuit 123 for exclusive ORing serial data SD output from complementary code inserting circuit 101 and pseudo-random pulse train MP generated from M series generator 121 so as to scramble serial data SD. Control circuit 122 is comprised of, for example, a D flip-flop 124 and an AND gate 125 as illustrated in FIG. 5. Load signal LOAD generated from timing circuit 112 of complementary code inserting circuit 101 is delayed by one bit time and inverted by D flip-flop 124. AND gate 25 is enabled by the one-bit-time delayed and inverted signal LOAD' to provide a control clock signal CS.

Figure 6:
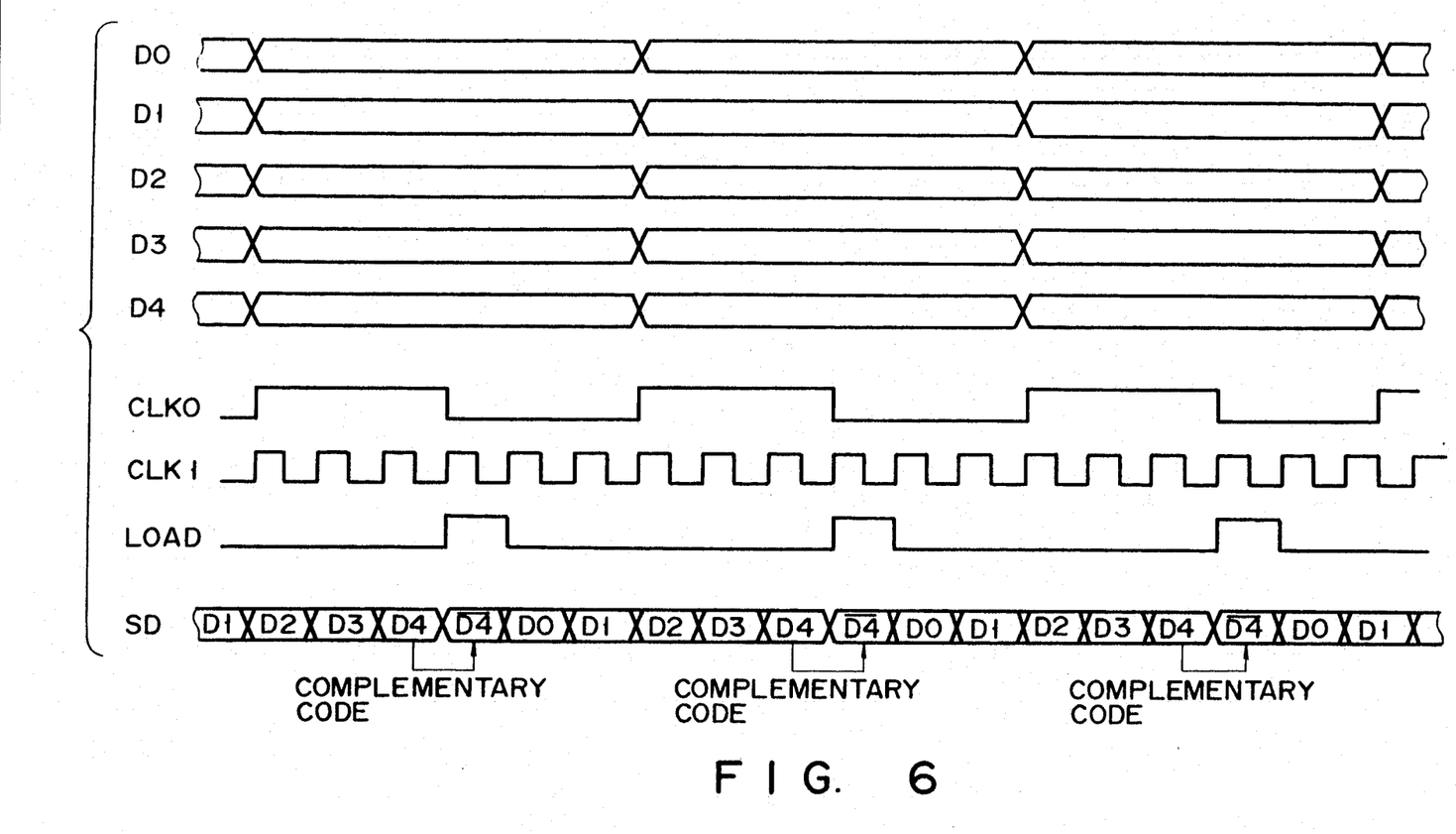
FIGS. 6 and 7 are timing charts for use in explanation of the operation of the circuits of FIGS. 4 and 5.

In such a signal conversion circuit, incoming parallel data is applied to input terminals P0 to P4 of shift register 111 as it is and bit D4 of the parallel data is inverted by inverter 113 to be applied to input terminal P5 of shift register 111 as complementary code $\overline{D4}$. The parallel data D0 to D4 and complementary code $\overline{D4}$ are loaded into shift register 111 in synchronization with load signal LOAD which is generated by timing circuit 112 in synchronization with the timing of arrival of the parallel data as shown in FIG. 6. The parallel data and complementary code are read out of shift register 111 serially in the order of D0, D1, D2, D3, D4 and $\overline{D4}$ to be output as serial data SD. That is, from shift register 111 is output serial data SD in which a redundant bit has been added through the serial to parallel conversion and a complementary code has been inserted into the redundant bit.

Figure 7:
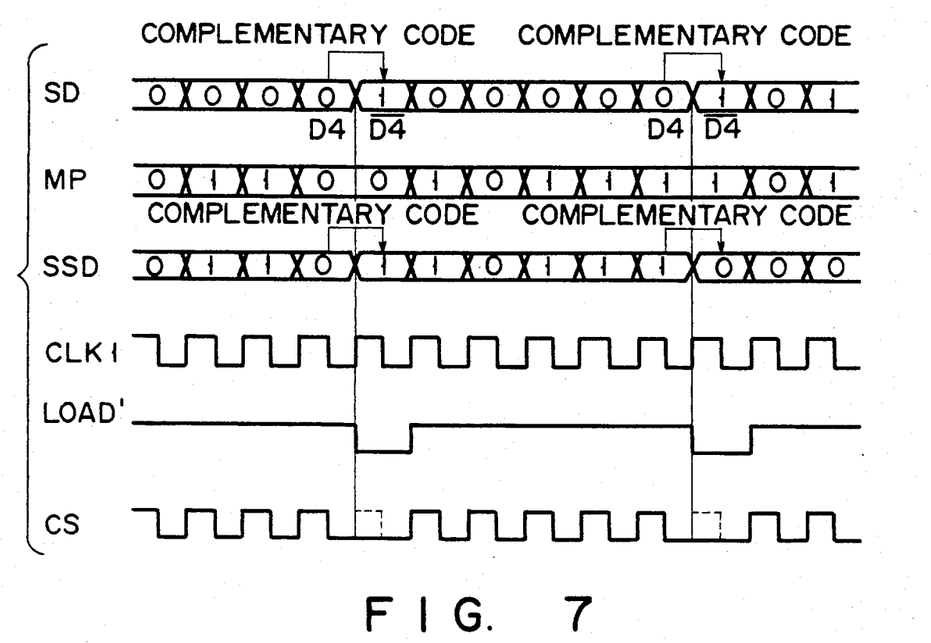

In scrambling circuit 102, on the other hand, control clock signal CS is generated from load signal LOAD and clock CLK1 supplied from timing circuit 112 of complementary code inserting circuit 101. As shown in FIG. 7, control clock CS is a pulse train in which a pulse corresponding to complementary code D4 in serial data SD is removed. For this reason, pseudo-random pulse train MP in which a code change is prohibited in positions corresponding to the complimentary code law forming positions (D4, $\overline{D4}$) of serial data SD as shown in FIG. 7 is generated from M series generator 121 synchronously with control clock signal CS. Thus, supposing that such serial data SD as shown in FIG. 7 is output from complementary code inserting circuit 111 and such a pseudo-random pulse train MP as shown in FIG. 7 is output from M series generator 121, such a signal SSD as shown in FIG. 7 will be output from exclusive OR circuit 123. That is, serial data SSD is output in which bits D0 to D4 are scrambled by pseudo-random pulse train MP and the complementary code rule in serial data SD is retained.

If such serial data SSD is transmitted, therefore, the complementary code can be detected from the transmission data simply and surely by a repeater or receiver because the complementary code rule between D4 and $\overline{D4}$ is retained, thereby permitting signal processing, such as error checking and phase adjustment, and descrambling process to be performed simply and surely. In addition, since a scrambling process can be performed on data in which a complementary code has been inserted, the conversion of parallel data D0 to D4 to serial data SD, namely, the addition of a redundant bit by rate conversion, and the insertion of the complementary code into the redundant bit can be performed collectively by shift register 111. As a result, the signal conversion circuit can be made simple and small in circuit arrangement.

Figure 8:
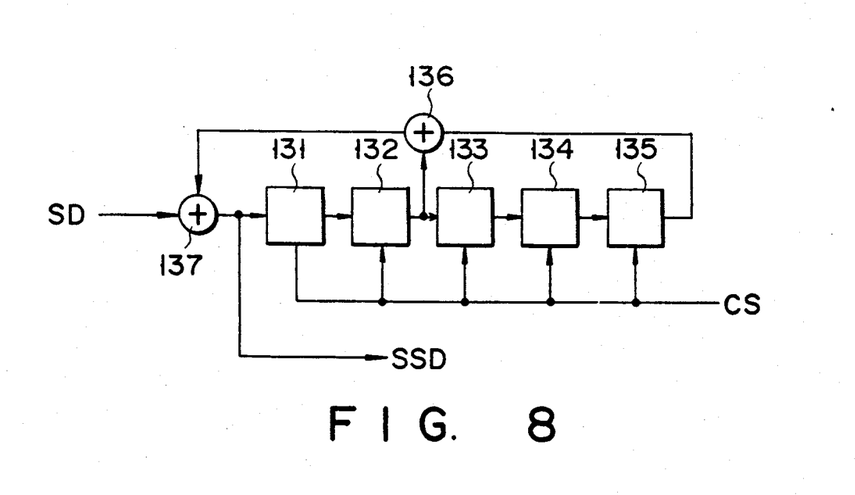
FIG. 8 is a block diagram of a scrambler in a signal conversion circuit according to still another embodiment of the present invention.

In the above embodiment, the scrambling circuit uses M series generator 121. Alternatively, this may use a self-synchronizing type of scrambling circuit which performs scrambling process by means of self-synchronization instead of using M series generator 121 and exclusive OR circuit 123. FIG. 8 illustrates an example of a self-synchronizing type of scrambling circuit. This circuit is comprised of five-stage shift registers 131 to 135 and exclusive OR circuits 136 and 137. In this circuit, output signal SD of complementary code inserting circuit 101 is entered into first-stage shift register 131 via exclusive OR circuit 137. Outputs of second-stage shift register 132 and final-stage shift register 135 are coupled to exclusive OR circuit 136. An output of exclusive OR circuit 136 and signal SD are exclusive ORed in exclusive OR circuit 137.

In the previous embodiment, control clock CS is generated in control circuit 122 by utilizing load signal LOAD generated from timing circuit 112 of complementary code inserting circuit 101 and clock signal CLK1. Alternatively, the position in which complementary code D4 is to be inserted may be detected from serial data SD to generate control clock signal CS on the basis of the result of detection. Furthermore, as in the previous embodiment, a shift register having input terminals corresponding in number to a maximum number of bits of parallel data plus one may be provided in advance so as to convert parallel data whose bit number is smaller than the maximum number of bits. That is, where a video signal is converted to a digital signal for transmission, 10 bits are adequate for the number of bits of parallel data. In this case, therefore, a shift register having input terminals corresponding in number to 10+1 bits may be provided in advance so as to convert parallel data in other applications to serial data. For example, in the case of 8-bit parallel data, the inverted output of eighth bit may be applied to the ninth input of the shift register. Moreover, the embodiment may be modified such that inverter 113 is provided on the least significant bit (LSB) side as illustrated in FIG. 1. If done so, the scrambling process can be performed with the complementary code rule retained and without any circuit modification of the conversion circuit. This will permit wide use and increased versatility of the signal conversion circuit. In addition, the integrated-circuit version of the circuit becomes easy, permitting its circuit scale to be made smaller. The configuration of the complementary code inserting circuit, the configuration of the scrambling circuit, the number of bits of input data, the number of bits of the complementary code, the position in which the complementary code is to be inserted, and the timing of loading of parallel data into the shift register may be modified variously without departing from the scope of the present invention.

As described in detail above, according to the present invention there is provided a signal conversion circuit which is simple in circuit arrangement and can obtain transmission data which surely retains a complementary code rule, by generating a pseudo-random code to retain the complementary code rule in data output from complementary code inserting circuit and performing a scrambling process on data output from the complementary code inserting circuit in accordance with the pseudorandom code.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A signal conversion circuit comprising:
    parallel input/serial output type of shift register means supplied with an input signal having a first number (n) of bits for converting a parallel signal to a serial signal the parallel signal containing the input data and constituted by a second predetermined number (n+k) of bits which is at least one (k) bit more than the first predetermined number (n), said shift register means having at least the second predetermined number of input terminals (n+k), and the first predetermined number (n) of successive input terminals of said shift register means being supplied with the input signal;
    inverting circuit means for inverting at least one bit of the input signal to apply an inverted bit signal to at least one of the input terminals of the shift register means; and
    timing circuit means for providing to the shift register means a first timing signal for permitting the input signal and the inverted signal to be loaded into the shift register means and a second timing signal for permitting the loaded signal to be read out of the shift register means at a predetermined rate.

2. A signal conversion circuit according to claim 1, in which the shift register means has an LSB input terminal corresponding to the least significant bit (LSB), and in which said inverting circuit means comprises an inverter for applying the inverted bit signal to the LSB input terminal of the shift register means.

3. A signal conversion circuit according to claim 1, in which said timing circuit means receives a first clock signal having a frequency corresponding to a transmission rate of the serial signal and a second clock signal having a lower frequency than the first clock signal and comprises a flip-flop means for latching the second clock signal in synchronization with the first clock signal and a logic gate means for performing a logical operation on the second clock signal and an output of the flip-flop means to produce the second timing signal.

4. A signal conversion circuit comprising:
    complementary code inserting means supplied with an original data signal having a first number (n) of bits for converting a first data signal to a second data signal, the first data signal containing the original data signal and constituted by a second number (n+k) of bits which is at least one (k) bit more than the first number (n) of bits, and for inserting a complementary code into the one bit to provide an output data signal; and
    scrambling means for generating a pseudo-random code for retaining the complementary code rule of the output data form the complementary code inserting means and scrambling the output data from the complementary code inserting means in accordance with the pseudorandom code.

5. A signal conversion circuit according to claim 4, in which said complementary code inserting means comprises:
    parallel input/serial output type of shift register means for converting a parallel signal corresponding to the first data signal to a serial signal corresponding to the second data signal, the shift register means having at least the second predetermined number (n+k) of input terminals, and the first predetermined number (n) of successive input terminals of said shift register means being supplied with the parallel signal;
    inverting circuit means for inverting at least one bit of the parallel signal to apply inverted bit signal to the remainder of the input signals of the shift register means; and
    timing circuit means for providing to the shift register means a first timing signal for permitting the parallel signal and the inverted signal to be loaded into the shift register means and a second timing signal for permitting the loaded signal to be read out of the shift register means at a predetermined rate.

6. A signal conversion circuit according to claim 4, in which said scrambling means comprises an M series generator for generating a pseudo-random pulse train, a control circuit for controlling the operation of the M series generator and an exclusive OR circuit for exclusive ORing the data output from the complementary code inserting means and the pseudo-random pulse train MP from the M series generator.

7. A signal conversion circuit according to claim 6, in which the control circuit comprises a flip-flop for delaying a load signal generated from the complementary code inserting circuit by one bit time and inverting it to provide an inverted signal and an AND gate responsive to the inverted signal to provide a control clock to the M series generator.

8. A signal conversion circuit according to claim 4, in which said scrambling means comprises a self-synchronizing type of scrambling circuit for scrambling the output data of the complementary code inserting means by self-synchronization.

9. A signal conversion circuit for converting a (n+k)-bit parallel signal (n and k: integer) containing an n-bit input signal to a serial signal comprising:
    a parallel input/serial output type of shift register having input terminals corresponding in number to at least (n+k) bits and receiving the parallel signal at its n successive input terminals;

an inverting circuit for inverting at least one (k) bit of the n-bit parallel signal and applying the inverted bit to the remaining k input terminal of the shift register; and timing circuit for allowing the (n+k)-bit parallel signal to be serially output from the shift register at a predetermined rate 10. A signal conversion circuit comprising:

complementary code inserting means for converting a first data containing input data of n-bits (n: integer) and constituted by n bits plus at least one bit to a second data and for inserting a complementary code into the one bit; and scrambling means for generating a pseudo-random code to retain the complementary code rule in output data from the complementary code inserting means and scrambling the output data from the complementary code inserting means in accordance with the pseudo-random code.

* * * * *

UNITED STATES PATENT AND TRADEMARK OFFICE
CERTIFICATE OF CORRECTION

PATENT NO. : 5,012,240

DATED : April 30, 1991

INVENTOR(S) : Shoichi Takahashi et al.

It is certified that error appears in the above-identified patent and that said Letters Patent is hereby corrected as shown below:

ON THE TITLE PAGE:

The Foreign Application Priority Data should be deleted.

Signed and Sealed this

Fifteenth Day of December, 1992

Attest:

DOUGLAS B. COMER

*Attesting Officer*  *Acting Commissioner of Patents and Trademarks*